United States Patent
Sohn et al.

(10) Patent No.: US 8,486,783 B2
(45) Date of Patent: Jul. 16, 2013

(54) SEMICONDUCTOR DEVICE AND METHOD OF MANUFACTURING THE SAME

(75) Inventors: Woong-hee Sohn, Seoul (KR); Byung-hee Kim, Seoul (KR); Dae-yong Kim, Yongin-si (KR); Min-sang Song, Seongnam-si (KR); Gil-heyun Choi, Seoul (KR); Kwang-jin Moon, Suwon-si (KR); Hyun-su Kim, Hwaseong-si (KR); Jang-hee Lee, Yongin-si (KR); Eun-ji Jung, Suwon-si (KR); Eun-ok Lee, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 564 days.

(21) Appl. No.: 12/658,520

(22) Filed: Feb. 11, 2010

(65) Prior Publication Data

US 2010/0240185 A1    Sep. 23, 2010

(30) Foreign Application Priority Data

Mar. 23, 2009    (KR) .................. 10-2009-0024574

(51) Int. Cl.
*H01L 21/336*    (2006.01)

(52) U.S. Cl.
USPC ........... 438/268; 438/233; 438/664; 257/328; 257/E21.41; 257/E21.618; 257/E21.633; 257/E21.634

(58) Field of Classification Search
USPC ........... 438/268, 664, 233; 257/328, E21.41, 257/E21.618, E21.819, E21.633, E21.634
See application file for complete search history.

(56) References Cited

U.S. PATENT DOCUMENTS

| | | | |
|---|---|---|---|
| 6,218,236 B1 | 4/2001 | Economikos et al. | |
| 2001/0017384 A1 | 8/2001 | Economikos et al. | |
| 2007/0295995 A1 | 12/2007 | Yun et al. | |
| 2008/0124869 A1* | 5/2008 | Yoon et al. | 438/268 |

FOREIGN PATENT DOCUMENTS

| | | |
|---|---|---|
| JP | 2000-223675 A | 8/2000 |
| KR | 10-0739532 B1 | 7/2007 |
| KR | 10-2008-0044504 A | 5/2008 |

* cited by examiner

*Primary Examiner* — Kimberly Rizkallah
*Assistant Examiner* — Maria Ligai
(74) *Attorney, Agent, or Firm* — Onello & Mello, LLP

(57) ABSTRACT

A method of manufacturing a semiconductor device includes: forming a trench for forming buried type wires by etching a substrate; forming first and second oxidation layers on a bottom of the trench and a wall of the trench, respectively; removing a part of the first oxidation layer and the entire second oxidation layer; and forming the buried type wires on the wall of the trench by performing a silicide process on the wall of the trench from which the second oxidation layer is removed. As a result, the buried type wires are insulated from each other.

17 Claims, 6 Drawing Sheets

US 8,486,783 B2

SEMICONDUCTOR DEVICE AND METHOD OF MANUFACTURING THE SAME

CROSS-REFERENCE TO RELATED APPLICATIONS

This application claims the benefit of Korean Patent Application No. 10-2009-0024574, filed on Mar. 23, 2009, in the Korean Intellectual Property Office, the entire contents of which are incorporated herein by reference.

BACKGROUND

The inventive concept relates to a semiconductor device, and more particularly, to a semiconductor device having buried type wires and a method of manufacturing the semiconductor device.

In semiconductor devices, as design rules are reduced and the size of chips is continuously decreasing, the area of unit cells that form the semiconductor devices also decreases. As a result, an alignment margin of a bit line and a word line is substantially reduced. Also, as a channel length of a flat transistor is reduced, a short channel effect is generated, and as a channel width of the flat transistor is reduced, a narrow width effect is generated.

Accordingly, a three-dimensional (3-D) transistor, such as a vertical type transistor, has been suggested in order to increase channel length and channel width in a limited domain, and a buried type bit line structure, which is buried in a substrate below a word line, has been introduced. A buried type bit line is formed by forming a trench on a substrate and forming a metal or metal silicide layer on a wall of the trench. However, while forming the metal or metal silicide layer on the wall of the trench, the metal or metal silicide layer may also be formed on the bottom of the trench.

SUMMARY

According to an aspect of the inventive concept, there is provided a method of manufacturing a semiconductor device, the method including: forming a trench for forming buried type wires by etching a substrate; forming first and second oxidation layers on a bottom of the trench and a wall of the trench, respectively; removing a part of the first oxidation layer and the entire second oxidation layer; and forming the buried type wires on the wall of the trench by performing a silicide process on the wall of the trench from which the second oxidation layer is removed.

In the forming of the first and second oxidation layers, the first oxidation layer may be formed to have a greater thickness than that of the second oxidation layer by performing a plasma oxidation process on the trench. In the forming of the first and second oxidation layers, a thickness ratio of the first and second oxidation layers may be adjusted by applying a bias voltage to a bottom of the substrate.

The method may further include removing the first oxidation layer and a portion of the substrate below the first oxidation layer to a predetermined depth, so as to insulate the buried type wires from each other.

In the removing of the part of the first oxidation layer and the entire second oxidation layer, the part of the first oxidation layer and the entire second oxidation layer may be removed by performing a pre-cleaning process on the substrate on which the first and second oxidation layers are formed.

The forming of the buried type wires on the wall of the trench may include: forming a metal layer on the substrate from which the part of the first oxidation layer and the entire oxidation layer are removed; performing a first thermal process on the substrate on which the metal layer is formed; removing a portion of the metal layer that does not react to the first thermal process; and forming a metal silicide layer constituting the buried type wires by performing a second thermal process on the substrate from which the portion of the metal layer that does not react to the first thermal process is removed.

The buried type wires may include buried type bit lines. The forming of the trench may include: forming a channel structure by patterning the substrate, and forming a gate electrode on a side of the channel structure; forming a spacer on the channel structure on which the gate electrode is formed; and forming the trench by etching the substrate, using the spacer as a mask.

The plasma oxidation process may use an oxygen gas or a gas comprising $O_2$ and at least one of a group of gases consisting of $H_2$, Ar, He, Xe, $NH_3$, NO, $N_2O$, and $N_2$ as a reaction gas. The metal layer may include at least one of a group of metals consisting of Co, Ti, Mo, Ta, Zr, W, and Ni.

According to another aspect of the inventive concept, there is provided a method of manufacturing a semiconductor device, the method including: forming a plurality of trenches and a plurality of channel structures by etching a substrate, each channel structure having a protruding shape from a region between two adjacent trenches of the plurality of trenches; forming a gate electrode on a portion of a side of the each channel structure; forming a first impurity area on an upper portion of the each channel structure; forming a second impurity area below the each channel structure; forming a plurality of buried type wires on a wall of each trench, each buried type wire being coupled to the second impurity area; and etching the plurality of trenches to a predetermined depth, so as to insulate the plurality of buried type wires from each other.

The plurality of buried type wires may include a plurality of buried type bit lines, the first impurity region may include source area, and the second impurity region may include a drain area.

The method may further include forming a plurality of word lines coupled to the gate electrode.

The forming the plurality of buried type wires may include: forming first and second oxidation layers on a bottom and a wall of at least one of the plurality of trenches, respectively; removing a part of the first oxidation layer and the entire second oxidation layer; and forming the plurality of buried type wires on the wall of the at least one trench by performing a silicide process on the wall of the at least one trench from which the second oxidation layer is removed.

In the forming of the first and second oxidation layers, the first oxidation layer may be formed to have a greater thickness than that of the second oxidation layer by performing a plasma oxidation process on the trench.

In the forming of the first and second oxidation layers, a thickness ratio of the first and second oxidation layers may be adjusted by applying a bias voltage to a bottom of the substrate.

In the removing of the part of the first oxidation layer and the entire second oxidation layer, the part of the first oxidation layer and the entire second oxidation layer may be removed by performing a pre-cleaning process on the substrate on which the first and second oxidation layers are formed.

The forming of the plurality of buried type wires on the wall of the at least one trench may include: forming a metal layer on the substrate from which the part of the first oxidation layer and the entire oxidation layer are removed; performing a first thermal process on the substrate on which the metal layer is formed; removing a portion of the metal layer that does not react to the first thermal process; and forming a metal silicide layer constituting the buried type wires by performing a second thermal process on the substrate from which the portion of the metal layer that does not react to the first thermal process is removed.

The plasma oxidation process may use an oxygen gas or a gas comprising $O_2$ and at least one of a group of gases consisting of $H_2$, Ar, He, Xe, $NH_3$, NO, $N_2O$, and $N_2$ as a reaction gas. The metal layer may include at least one of a group of metals consisting of Co, Ti, Mo, Ta, Zr, W, and Ni.

According to another aspect of the inventive concept, there is provided a semiconductor device including: a substrate including a plurality of trenches; a plurality of channel structures, each channel structure having a protruding shape from a region between two adjacent trenches of the plurality of trenches in the substrate; a gate electrode formed on a portion of a side of the each channel structure; a first impurity area formed on an upper portion of the each channel structure; a second impurity area formed below the each channel structure; and a plurality of buried type wires formed on a wall of each trench, each buried type wire being coupled to the second impurity area, wherein a depth of the each trench is greater than a depth of the each buried type wire.

The plurality of buried type wires may include a plurality of buried type bit lines, the first impurity region may include a source area, and the second impurity region may include a drain area.

The device may further include a plurality of word lines coupled to the gate electrode.

The plurality of buried type wires may include at least one of the group of metals consisting of Co, Ti, Mo, Ta, Zr, W, and Ni or a metal silicide thereof.

BRIEF DESCRIPTION OF THE DRAWINGS

The foregoing and other features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF THE EMBODIMENTS

Figure 1:
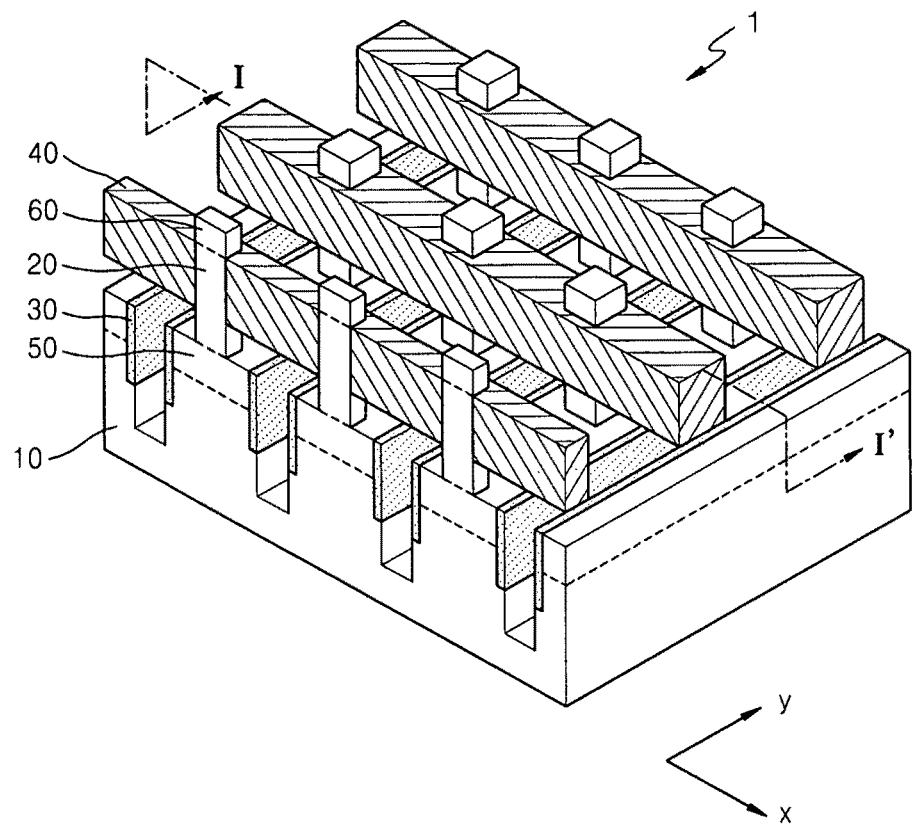
FIG. 1 is a perspective view schematically illustrating a semiconductor device according to an embodiment of the inventive concept.

Hereinafter, exemplary embodiments of the inventive concept will be described fully with reference to attached drawings.

The embodiments may have many different forms and should not be construed as being limited to those set forth herein; rather, these embodiments are provided so that this description will be thorough and complete and will fully convey the inventive concept to those skilled in the art. In the drawings, the sizes and thicknesses of layers are exaggerated for clarity.

It will be understood that when an element, such as a layer, an area, a region or a substrate, is referred to as being "on" or "connected to" another element, it can be directly on or connected to the other element, or intervening elements can be present. Alternatively, when an element is referred to as being "directly on" or "directly connected to" another element, intervening elements do not exist. Like reference numerals denote like elements.

The terms "first," "second," and the like are used herein to describe various areas, layers, and/or portions, but the areas, layers, and/or portions are not limited by these terms. Theses terms are only used to distinguish an area, layer, or portion from another area, layer, or portion. Accordingly, a first area, layer, or portion that will be described later may denote a second area, layer, or portion without deviating from teachings of the inventive concept.

Also, relative terms such as "upper" or "above", and "lower" or "below" may be used herein to describe relationship between elements as shown in the drawings. The relative terms may be understood to include other directions of a device, in addition to a direction shown in the drawings. For example, when elements are shown to be disposed on upper surfaces of other elements and a device is turned over in the drawings, the elements are disposed on bottom surfaces of the other elements. Accordingly, the term "upper" may include both "lower" and "upper" directions based on a certain direction in the drawings. When the device faces another direction, for example, when the device rotates 90°, the relative terms used herein may be interpreted accordingly.

The terms used herein are used to describe certain embodiments, and are not used to limit the scope of the inventive concept. A singular form may include a plural form, unless clearly defined otherwise. Also, the terms "comprise" and/or "comprising" specify existence of mentioned shapes, numbers, steps, operations, elements, members, and/or a group thereof, and do not exclude existence or addition or at least one of other shapes, numbers, steps, operations, elements, members, and/or groups thereof.

An embodiment of the inventive concept relates to a method of forming buried type wires in which the buried type wires are disposed within a groove or trench formed by etching a substrate. Accordingly, the method may be applied to, for example, a process of forming predetermined buried type wires, such as a process of forming a buried type bit line of a vertical type transistor or a process of forming a source line of a flash memory device. The method according to the present embodiment will now be described with reference to a method of forming a buried type bit line of a vertical type transistor. However, one of ordinary skill in the art will understand that the inventive concept is not limited thereto.

FIG. 1 is a perspective view schematically illustrating a semiconductor device 1 according to an embodiment of the inventive concept.

Referring to FIG. 1, the semiconductor device 1 includes a plurality of vertical type transistors formed on a substrate 10. Here, the substrate 10 may be a semiconductor substrate, and may include any one of, for example, silicon, silicon-on-insulator, silicon-on-sapphire, germanium, silicon-germanium, and gallium-arsenide.

A plurality of channel structures 20 are arranged in a matrix form on the substrate 10, wherein each of the channel structures 20 has a protruding pillar shape. The channel structures 20 according to the current embodiment have a rectangular pillar shape as illustrated in FIG. 1, but the shape of the channel structures 20 is not limited thereto, and may be different. A drain area 50 is formed below the channel structures 20, a source area 60 is formed on the channel structures 20, a gate electrode (not shown) is formed on a side of the channel structures 20, and each of the channel structures 20 forms a vertical type transistor.

A buried type bit line 30 is formed in a column direction (y-axis direction) of the semiconductor device 1, and is electrically connected to the drain area 50 of the vertical type transistor arranged on a corresponding column. Also, a word line 40 is formed in a row direction (x-axis direction) of the semiconductor device 1, and is electrically connected to the gate electrode of the vertical type transistor arranged in a corresponding row. Here, the terms "row" and "column" are used to indicate two different directions on the substrate 10, and do not necessarily indicate an absolute vertical direction and horizontal direction. For example, the row may be parallel to an x-axis and the column may be parallel to a y-axis, or vice versa.

Figure 2:
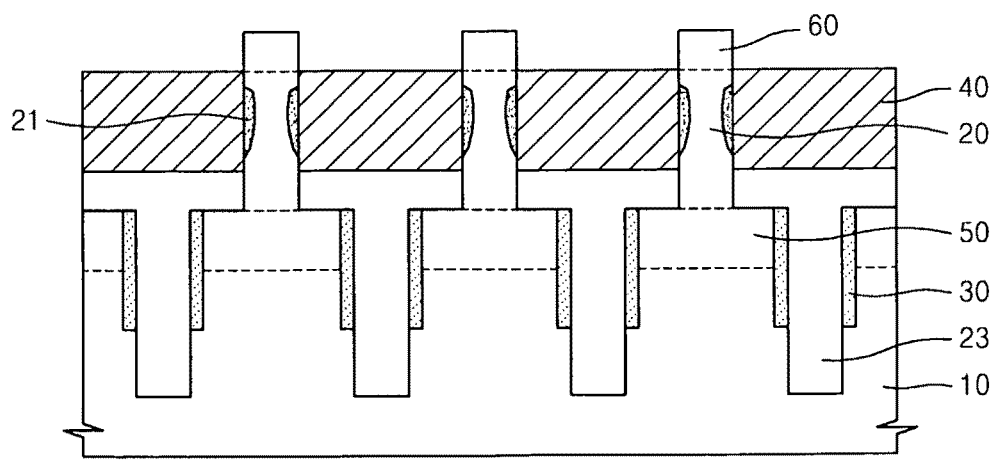
FIG. 2 is a cross-sectional view taken along a line I-I' of the semiconductor device of FIG. 1.

FIG. 2 is a cross-sectional view taken along a line I-I' of the semiconductor device 1 of FIG. 1.

Referring to FIG. 2, the plurality of channel structures 20 are formed on the substrate 10. Here, the channel structures 20 are formed by etching a predetermined area of the substrate 10, and gate electrodes 21 are formed on both sides of the channel structures 20. The drain area 50 is formed by performing an ion injecting process on the portion of the substrate 10 below the channel structures 20. Also, the source area 60 is formed by performing an ion injecting process on an upper portion of the channel structures 20.

The buried type bit line 30 is formed on a wall of a trench 23 formed in the substrate 10, and is electrically connected to the drain area 50. Also, the word line 40 is formed on the substrate 10 and is electrically connected to the gate electrode 21. The buried type bit line 30 and the word line 40 may be formed of polysilicon, a metal, a metal silicide, or a mixture thereof.

As such, a buried type bit line is formed by forming a trench on a substrate, and forming a metal or a metal silicide layer on a wall of the trench. While forming the metal or the metal silicide layer on the wall of the trench, the metal or the metal silicide layer may also be formed on a bottom of the trench. However, the metal or metal silicide layer formed on the bottom of the trench may not be removed via dry-etching or wet-etching, according to a type of the metal. When the metal or metal silicide layer formed on the bottom of the trench is not removed, a bridge may be generated between the buried type bit lines formed on the walls of the trench, and cells may not be separated from each other.

Specifically, for example, cobalt (Co) or a cobalt silicide (CoSix) is not completely removed via dry-etching or wet-etching. Accordingly, when cobalt or cobalt silicide is used to form a buried type bit line, a cobalt or cobalt silicide layer formed on a bottom of a trench is not completely removed, and thus cobalt or cobalt silicide layers formed on walls of the trench are not electrically insulated from each other.

FIGS. 3 through 9 are cross-sectional views illustrating a method of manufacturing a semiconductor device, according to an embodiment of the inventive concept.

Figure 3:
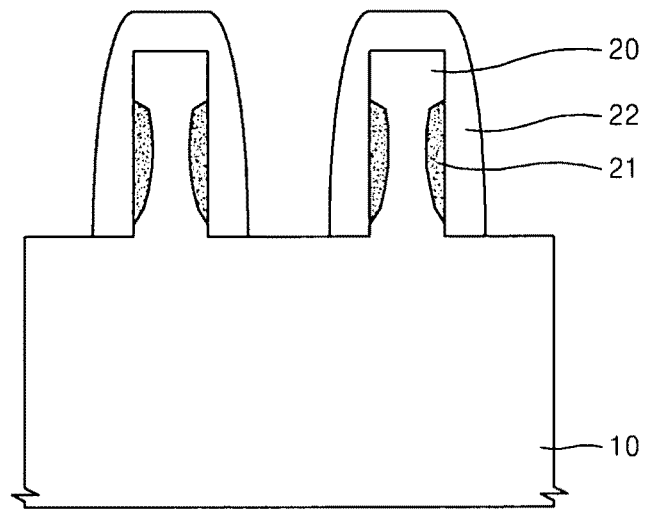
FIGS. 3 through 9 are cross-sectional views for describing a method of manufacturing a semiconductor device, according to an embodiment of the inventive concept.

Referring to FIG. 3, channel structures 20 are formed by etching a portion of a substrate 10 to a first depth. For example, a predetermined area of the substrate 10 may be etched to a depth of 3000 Å so as to form the channel structures 20. Also, a gate insulation layer (not shown) and a gate electrode 21 are sequentially formed on a side of each of the channel structures 20. Here, the gate electrode 21 may include polysilicon, a metal, a metal silicide, or a mixture thereof. According to an embodiment, the gate insulation layer and the gate electrode 21 may be sequentially formed by removing a part of a side of the channel structures 20 by using an etching solution.

Also, a drain area (not shown) is formed by injecting ions on the portion of the substrate 10 below the channel structures 20. Then, an oxidation layer is formed on the substrate 10 on which the channel structures 20 are formed, and a spacer 22 is formed by performing etchback on an entire surface of the deposited oxidation layer. Here, the spacer 22 may be an oxidation layer, a silicon oxidation layer, a silicon nitride layer, a silicon oxide nitride layer, or a mixture thereof.

Figure 4:
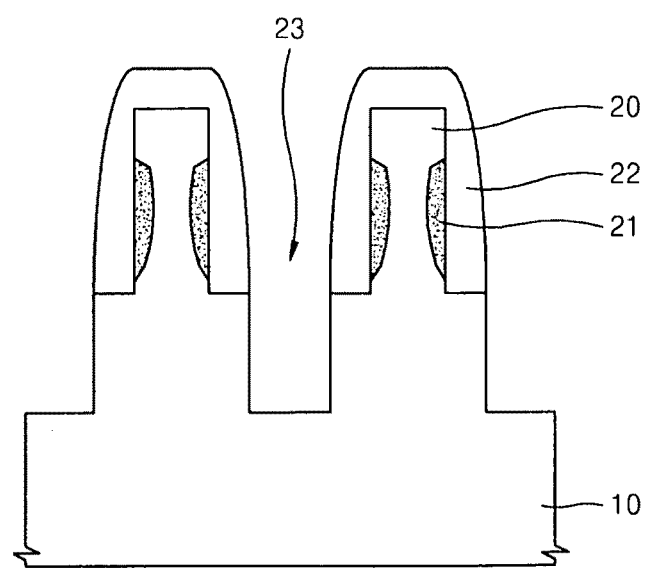

Referring to FIG. 4, a trench 23 is formed by etching the substrate 10 to a second depth using the spacer 22 formed on the channel structures 20 as a mask. For example, the trench 23 may be formed by dry-etching the substrate 10 to a depth of 500 Å using the spacer 22 as a mask. The trench 23 is a space for forming a buried type bit line.

Figure 5:
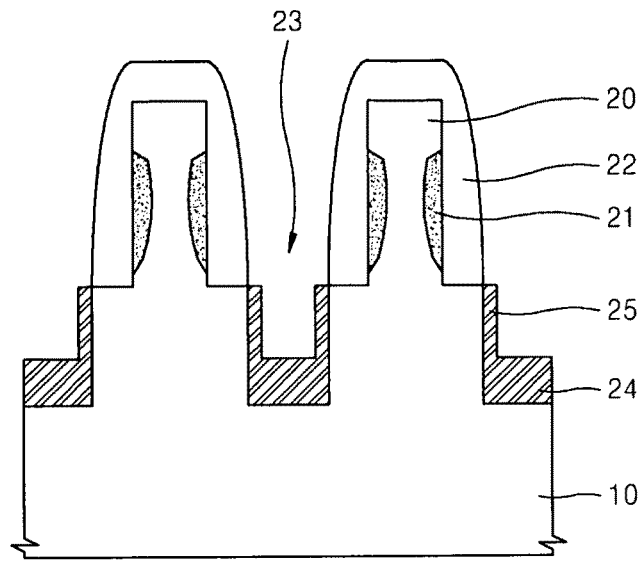

Referring to FIG. 5, by performing a selective oxidation process on the substrate 10 in which the trench 23 is formed, a first oxidation layer 24 having a first thickness is formed on a bottom of the trench 23, and a second oxidation layer 25 having a second thickness that is less than the first thickness is formed on a wall of the trench 23. For example, the first thickness of the first oxidation layer 24 may be equal to or greater than 50 Å, and the second thickness of the second oxidation layer 25 may be equal to or less than 20 Å.

According to an embodiment, the first and second oxidation layers 24 and 25 may be formed by performing a plasma oxidation process on the substrate 10 in which the trench 23 is formed. In this regard, in the plasma oxidation process, a reaction gas is injected into a chamber, plasma is generated from the injected reaction gas, and an oxidation layer is formed by using the generated plasma. For example, a temperature of the chamber in which the plasma oxidation process is performed may be about 1000° C., pressure thereof may be in a range of about 50 mTorr to about 20 Torr, and power applied to the chamber may be in a range of about 20 W to about 5000 W.

Here, the reaction gas is used as a plasma source, and may be an oxygen ($O_2$) gas. Alternatively, the reaction gas may include a hydrogen ($H_2$) gas and an oxygen gas. Alternatively, the reaction gas may include an oxygen gas and at least one of a plurality of inert gases, such as argon (Ar), helium (He), neon (Ne), and xenon (Xe). Alternatively, the reaction gas may include an oxygen gas and at least one of the group consisting of $NH_3$, NO, $N_2O$, and $N_2$. As such, since the reaction gas includes another gas beside an oxygen gas, an oxidation layer formed via a plasma oxidation process is densely formed, and thus the quality of the first and second oxidation layers 24 and 25 is increased.

In the chamber in which the plasma oxidation process is performed, a thickness of an oxidation layer may be different based on a location where plasma is generated. In detail, in the chamber in which the plasma oxidation process is performed, a thicker oxidation layer may be formed in an area close to a location where plasma is generated. Accordingly, in an embodiment, when plasma is generated in an area adjacent to the substrate 10, the first oxidation layer 24 formed on the bottom of the trench 23 adjacent to the substrate 10 may be thicker than the second oxidation layer 25 formed on the wall of the trench 23.

According to an embodiment, a ratio of the first thickness and the second thickness may be adjusted by applying a bias voltage to a bottom of the substrate 10. In detail, when a relatively high bias voltage is applied to the bottom of the substrate 10, an oxidation layer on the bottom of the trench 23 is actively formed, and thus the first thickness may be significantly greater than the second thickness. Alternatively, when a relatively low bias voltage is applied to the bottom of the substrate 10, the first thickness may be similar to the second thickness.

Figure 6:
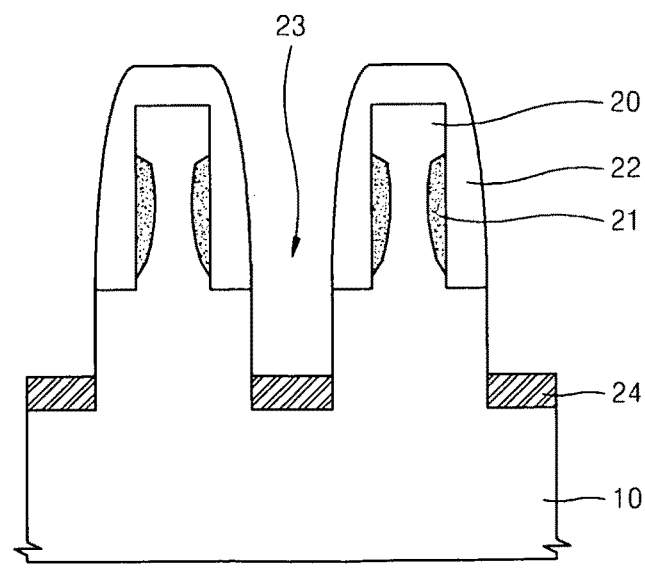

Referring to FIG. 6, a part of the first oxidation layer 24 and the entire second oxidation layer 25 are removed by performing a pre-cleaning process on the substrate 10 on which the first and second oxidation layers 24 and 25 are formed. In the above example, since the first thickness is equal to or greater than 50 Å and the second thickness is equal to or less than 20 Å, about 20 Å of the first and second oxidation layers 24 and 25 may be removed by performing the pre-cleaning process on the substrate 10 on which the first and second oxidation layers 24 and 25 are formed. Accordingly, the part of the first oxidation layer 24 is removed, so that the remaining thickness of the first oxidation layer 24 is equal to or greater 30 Å, and the entire second oxidation layer 25 is removed.

By forming the first thickness to be greater than the second thickness via the selective oxidation process in FIG. 5, the part of the first oxidation layer 24 and the entire second oxidation layer 25 are removed by performing the pre-cleaning process. Accordingly, the first oxidation layer 24 is exposed on the bottom of the trench 23, and the substrate 10 is exposed on the wall of the trench 23.

Figure 7:
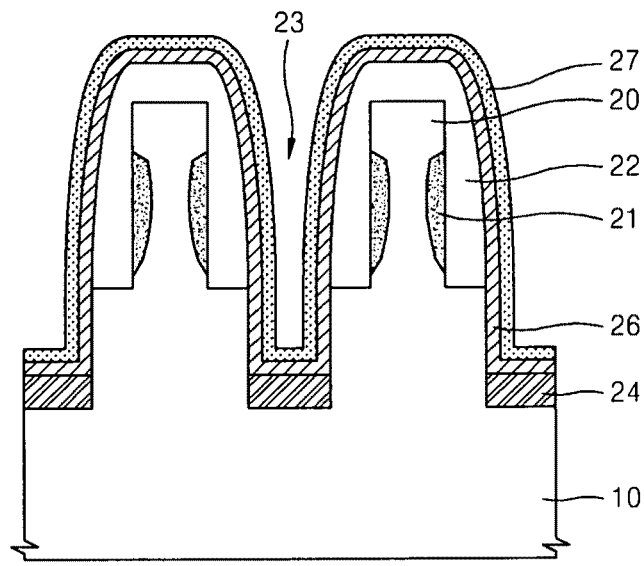

Referring to FIG. 7, a metal layer 26 is formed on the substrate 10, from which the part of the first oxidation layer 24 and the entire second oxidation layer 25 are removed, and then a capping layer 27 is formed on the metal layer 26. In detail, the metal layer 26 and the capping layer 27 may be formed by using at least one of chemical vapor deposition (CVD), atomic layer deposition (ALD), plasma enhanced CVD (PECVD), plasma assisted ALD (PAALD), and cyclic CVD. In this regard, the metal layer 26 may include at least one of the group of metals consisting of cobalt (Co), titanium (Ti), molybdenum (Mo), tantalum (Ta), zirconium (Zr), tungsten (W), and nickel (Ni). Hereinafter, an exemplary case in which the metal layer 26 includes cobalt will be described. Cobalt is selected as the material for the metal layer 26 merely as an example for illustration purposes. As noted above, the inventive concept is applicable to other materials used for the metal layer 26. Also, the capping layer 27 may include Ti, TiN, or a mixture thereof.

Figure 8:
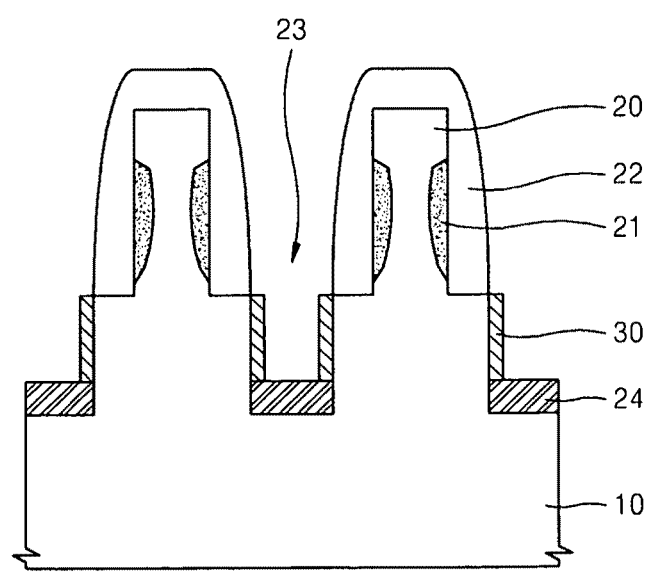

Referring to FIG. 8, a metal silicide layer 30 to be used as buried type bit lines is formed by performing a thermal process, such as rapid thermal silicidation (RTS) process on the substrate 10 on which the metal layer 26 and the capping layer 27 are formed. According to an embodiment, the metal layer 26 may be formed of cobalt, and thus an exemplary silicidation process when the metal layer 26 is formed of cobalt will now be described.

CoSi is formed by performing a first thermal process on the substrate 10 on which the metal layer 26 and the capping layer 27 are formed. Here, since a part of the first oxidation layer 24 is left on the bottom of the trench 23, a reaction is not generated between the portion of the substrate 10 at the bottom of the trench 23 and the metal layer 26 even when a thermal process is performed. However, since the substrate 10 is exposed to the metal layer 26 on the wall of the trench 23, a silicidation reaction is generated between a silicon component of the substrate 10 and the metal layer 26 via the first thermal process. Accordingly, the metal silicide layer 30 is only formed on the wall of the trench 23. Here, the first thermal process may be performed at a temperature in a range of about 400 to about 600° C.

Then, a portion of the metal layer 26 which is not silicided via the first thermal process is selectively removed. In detail, the portion of the metal layer 26 which is not silicided via the first thermal process may be selectively removed by performing a wet-etching process on the substrate 10 on which the first thermal process is performed. Here, the wet-etching process may be performed by using a $H_2SO_2$-based solution, such as peroxyacetyl nitrate (PAN). Accordingly, the portion of the metal layer 26 and the capping layer 27 on the spacer 22, the portions of the metal layer 26 and the capping layer 27 on the bottom of the trench 23, and the portion of the capping layer 27 on the wall of the trench 23, which are not silicided via the first thermal process, are removed.

Then, $CoSi_2$ is formed by performing a second thermal process on the substrate 10 where CoSi is formed. In this regard, the $CoSi_2$ constitutes the metal silicide layer 30 to be used as the buried type bit line. The second thermal process may be performed at a temperature of about 650° C. As such, by forming the metal silicide layer 30 by performing the first and second thermal processes, the metal silicide layer may be uniformly formed, and nonresistance of the metal silicide layer may be reduced.

According to another embodiment, when the metal layer 26 is formed of titanium, a metal silicide layer may be formed by performing the first and second thermal processes as described above. According to another embodiment, when the metal layer 26 is formed of tungsten or nickel, a metal silicide layer may be formed by performing a single thermal process.

Figure 9:
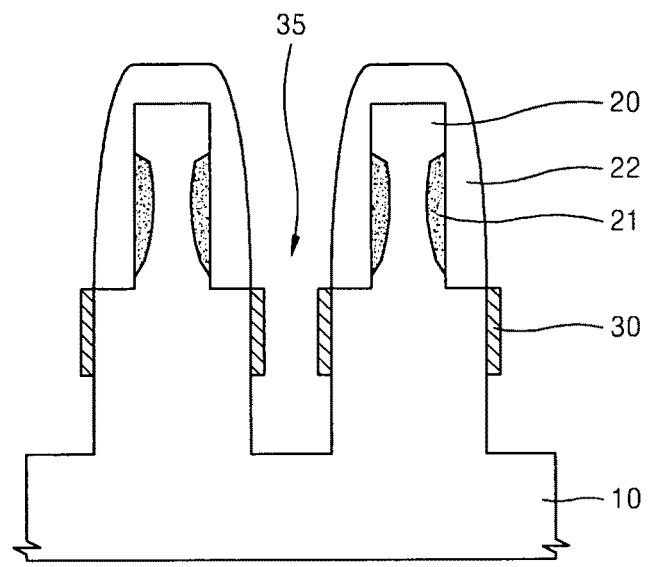

Referring to FIG. 9, the first oxidation layer 24 left on the bottom of the trench 23 is removed, and then a trench 35 is formed by etching the portion of the substrate 10 below the first oxidation layer 24 to a third depth. Accordingly, the metal silicide layer 30 to be used as the buried type bit lines formed on the wall of the trench 35 are insulated from each other. For example, the first oxidation layer 24 and the substrate 10 may be dry-etched to a depth of about 1500 to about 2000 Å.

Figure 10:
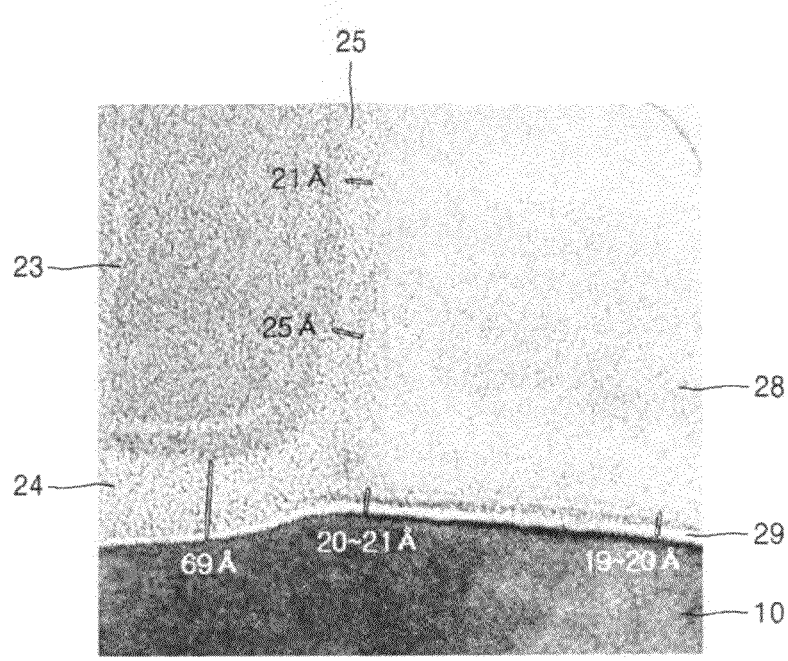
FIG. 10 is a photographic image of an example of first and second oxidation layers of the semiconductor device of FIG. 2, formed according to an embodiment of the inventive concept.

FIG. 10 is an image of an example of the first and second oxidation layers 24 and 25 of the semiconductor device of FIG. 2, formed according to an embodiment of the inventive concept.

Referring to FIG. 10, the first and second oxidation layers 24 and 25 are formed by performing a plasma oxidation process on the substrate 10 in which the trench 23 is formed. Here, the first and second oxidation layers 24 and 25 may be formed to have different thicknesses by using the plasma oxidation process. In FIG. 10, the thickness of the first oxidation layer 24 formed on the bottom of the trench 23 may be about 69 Å, and the thickness of the second oxidation layer 25 formed on the wall of the trench 23 may be about 21 to about 25 Å. The gate insulation layer 29 is disposed beside the trench 23 and has a thickness of about 20 Å, and polysilicon 28 is disposed on the gate insulation layer 29.

As such, the thickness of the first oxidation layer 24 may be formed to be twice or triple the thickness of the second oxidation layer 25 via the plasma oxidation process. Accordingly, when the thickness of the first oxidation layer 24 is greater than the thickness of the second oxidation layer 25, a part of the first oxidation layer 24 may be left even when all of the second oxidation layer 25 is removed via a pre-cleaning process, i.e., a process following the plasma oxidation process. Consequentially, a metal silicide layer may not be formed on the bottom of the trench 23 during a silicide process, i.e., a process following the pre-cleaning process.

Figure 11:
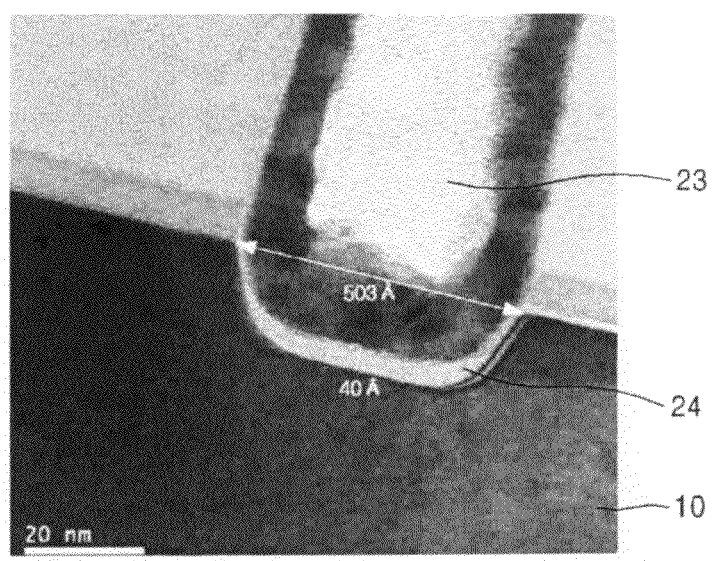
FIG. 11 is a photographic image of an example of a metal silicide layer of the semiconductor device of FIG. 2, formed according to an embodiment of the inventive concept.

FIG. 11 is an image of an example of a metal silicide layer of the semiconductor device of FIG. 2, formed according to an embodiment of the inventive concept.

Referring to FIG. 11, the first oxidation layer 24 formed on the bottom of the trench 23 is removed when the second oxidation layer 25 formed on the wall of the trench 23 is removed via the pre-cleaning process, after forming the first oxidation layer 24 on the bottom of the trench 23 and forming the second oxidation layer 25 on the wall of the trench 23. However, since the first oxidation layer 24 is thicker than the second oxidation layer 25, a part of the first oxidation layer 24 is left even after the pre-cleaning process. In the example of FIG. 11, the thickness of the first oxidation layer 24 is about 40 Å after the pre-cleaning process.

Here, a metal silicide layer is not formed on the bottom of the trench 23 where a part of the first oxidation layer 24 is left, even when the silicide process is performed on the substrate 10 on which the part of the first oxidation layer 24, and the second oxidation layer 25 are removed.

A vertical type transistor according to an embodiment formed as described above may be applied to a dynamic random access memory (DRAM).

While the inventive concept has been particularly shown and described with reference to exemplary embodiments thereof, it will be understood that various changes in form and details may be made therein without departing from the spirit and scope of the following claims.

What is claimed is:

1. A method of manufacturing a semiconductor device, the method comprising:
   forming a trench for forming buried type wires by etching a substrate;
   forming first and second oxidation layers on a bottom of the trench and a wall of the trench, respectively;
   removing a part of the first oxidation layer and the entire second oxidation layer; and
   forming the buried type wires on the wall of the trench by performing a silicide process on the wall of the trench from which the second oxidation layer is removed.

2. The method of claim 1, wherein, in the forming of the first and second oxidation layers, the first oxidation layer is formed to have a greater thickness than that of the second oxidation layer by performing a plasma oxidation process on the trench.

3. The method of claim 2, wherein, in the forming of the first and second oxidation layers, a thickness ratio of the first and second oxidation layers is adjusted by applying a bias voltage to a bottom of the substrate.

4. The method of claim 2, further comprising removing the first oxidation layer and a portion of the substrate below the first oxidation layer to a predetermined depth, so as to insulate the buried type wires from each other.

5. The method of claim 2, wherein, in the removing of the part of the first oxidation layer and the entire second oxidation layer, the part of the first oxidation layer and the entire second oxidation layer are removed by performing a pre-cleaning process on the substrate on which the first and second oxidation layers are formed.

6. The method of claim 2, wherein the forming of the buried type wires on the wall of the trench comprises:
   forming a metal layer on the substrate from which the part of the first oxidation layer and the entire oxidation layer are removed;
   performing a first thermal process on the substrate on which the metal layer is formed;
   removing a portion of the metal layer that does not react to the first thermal process; and
   forming a metal silicide layer constituting the buried type wires by performing a second thermal process on the substrate from which the portion of the metal layer that does not react to the first thermal process is removed.

7. The method of claim 6, wherein the metal layer comprises at least one of a group of metals consisting of Co, Ti, Mo, Ta, Zr, W, and Ni.

8. The method of claim 2, wherein the buried type wires comprise buried type bit lines.

9. The method of claim 8, wherein the forming of the trench comprises:
   forming a channel structure by patterning the substrate, and forming a gate electrode on a side of the channel structure;
   foaming a spacer on the channel structure on which the gate electrode is formed; and
   forming the trench by etching the substrate, using the spacer as a mask.

10. The method of claim 2, wherein the plasma oxidation process uses an oxygen gas or a gas comprising $O_2$ and at least one of a group of gases consisting of $H_2$, Ar, He, Xe, $NH_3$, NO, $N_2O$, and $N_2$ as a reaction gas.

11. A method of manufacturing a semiconductor device, the method comprising:
   forming a plurality of trenches and a plurality of channel structures by etching a substrate, each channel structure having a protruding shape from a region between two adjacent trenches of the plurality of trenches;
   forming a gate electrode on a portion of a side of the each channel structure;
   forming a first impurity area on an upper portion of the each channel structure;
   forming a second impurity area below the each channel structure;
   forming a plurality of buried type wires on a wall of each trench, each buried type wire being coupled to the second impurity area, wherein the depth of the buried type wire is greater than that of the second impurity area, wherein the forming the plurality of buried type wires comprises:
      forming first and second oxidation layers on a bottom and a wall of at least one of the plurality of trenches, respectively;
      removing a part of the first oxidation layer and the entire second oxidation layer; and
      forming the plurality of buried type wires on the wall of the at least one trench by performing a silicide process on the wall of the at least one trench from which the second oxidation layer is removed; and
   etching the plurality of trenches to a predetermined depth, so as to insulate the plurality of buried type wires from each other.

12. The method of claim 11, wherein, in the forming of the first and second oxidation layers, the first oxidation layer is formed to have a greater thickness than that of the second oxidation layer by performing a plasma oxidation process on the trench.

13. The method of claim 12, wherein the plasma oxidation process uses an oxygen gas or a gas comprising $O_2$ and at least one of a group of gases consisting of $H_2$, Ar, He, Xe, $NH_3$, NO, $N_2O$, and $N_2$ as a reaction gas.

14. The method of claim 11, wherein, in the forming of the first and second oxidation layers, a thickness ratio of the first and second oxidation layers is adjusted by applying a bias voltage to a bottom of the substrate.

15. The method of claim 11, wherein, in the removing of the part of the first oxidation layer and the entire second oxidation layer, the part of the first oxidation layer and the entire second oxidation layer are removed by performing a pre-cleaning process on the substrate on which the first and second oxidation layers are formed.

16. The method of claim 11, wherein the forming of the plurality of buried type wires on the wall of the at least one trench, comprises:
   forming a metal layer on the substrate from which the part of the first oxidation layer and the entire oxidation layer are removed;
   performing a first thermal process on the substrate on which the metal layer is formed;
   removing a portion of the metal layer that does not react to the first thermal process; and
   forming a metal silicide layer constituting the buried type wires by performing a second thermal process on the substrate from which the portion of the metal layer that does not react to the first thermal process is removed.

17. The method of claim 16, wherein the metal layer comprises at least one of a group of metals consisting of Co, Ti, Mo, Ta, Zr, W, and Ni.

* * * * *